United States Patent [19]

Blahut et al.

[11] 4,208,728
[45] Jun. 17, 1980

[54] PROGRAMABLE LOGIC ARRAY

[75] Inventors: Donald E. Blahut, Holmdel; James A. Cooper, Jr., Warren, both of N.J.

[73] Assignee: Bell Telephone Laboratories, Incorporated, Murray Hill, N.J.

[21] Appl. No.: 971,866

[22] Filed: Dec. 21, 1978

[51] Int. Cl.² .......................................... G11C 11/40
[52] U.S. Cl. ........................ 365/154; 365/189; 307/238
[58] Field of Search ............ 365/154, 156, 174, 189; 307/238

[56] References Cited

U.S. PATENT DOCUMENTS 3,969,708  7/1976  Sonoda ........................... 365/154
3,983,412  9/1976  Roberts et al. .................. 365/154

Primary Examiner—Terrell W. Fears
Attorney, Agent, or Firm—Herbert M. Shapiro

[57] ABSTRACT

The decoder portion of a programable logic array (PLA) includes logic devices at crosspoints defined between the word (x) lines and the address (y) lines characteristic of a decoder portion. The devices are operative to combine two or more word lines to activate a single word line in the associated read only memory (ROM) in response to one of two or more possible inputs. The technique is effective even in cases where "don't care" conditions relating the two or more possible inputs cannot be found. A substantial reduction in chip area is achieved.

6 Claims, 5 Drawing Figures

PROGRAMABLE LOGIC ARRAY

FIELD OF THE INVENTION

This invention relates to integrated semiconductor circuits.

BACKGROUND OF THE INVENTION

It is well known that commercial processing procedures dictate maximum semiconductor chip size. It follows that the area of the chip is at a premium and, consequently, any improvement in area usage is significant. In integrated circuits, such as microprocessor chips in particular, where many functions are performed in a single chip, the proximity of the sites of cooperating functions to one another alone can be important because proper location may, for example, lead to shorter transmission paths and the sharing of those paths.

The present invention is directed at the problem of realizing necessary functions with relatively small chip areas in multifunction type integrated circuits of the microprocessor type. For example, a microprocessor includes a programable logic array (PLA) comprising a read-only memory (ROM) portion and a decoder portion which applies "address select" signals to the memory word lines in response to input signals applied by logic circuits external to the decoder portion. The memory and decoder portions of the PLA are alike in that they both are word organized and, typically, include ground lines interleaved with the word lines. Switch elements in the decoder portion formed at crosspoints between (word) lines which intersect the address lines cause grounding of ones of those intersecting word lines, through associated ground lines, when the associated switch elements are in the conductive state. For the decoder portion, input signals from an external logic circuit arrangement cause output signals to be applied to selected word lines of the memory portion depending on the pattern of grounded decoder word lines. Programable logic arrays are described in *MOS/LSI Design and Application*, Texas Instruments Electronics Series, by Carr and Mize, 1972, starting at page 229.

One problem with such arrangements is that a relatively large area is required to implement a PLA because a separate word line has been required hitherto for each set of signals to be applied to the memory portion by the decoder portion in response to each different input code. This one-to-one correspondence between word lines of the memory portion and input codes exists except in cases where input codes could be so assigned as to produce "don't-care" conditions. In the latter cases, a single word line may be responsive to more than one input code. But, in general, the assignment of input codes to take advantage of "don't-care" conditions is not always possible.

BRIEF DESCRIPTION OF THE INVENTION

The present invention is based on the realization that the inclusion of logic devices at crosspoints between address and word lines in a decoder portion of a PLA permits selection of a single word line of the associated memory portion in response to different input codes applied to the decoder portion. Specifically, the foregoing problem is solved by the use of logic devices at the crosspoints of a decoder portion which arranges the decoder portion so that the word lines therein are associated in groups and each group is connected to a single word line in the ROM portion in a manner to respond to multiple input codes to select that single word line. A significant reduction in chip area results.

The inclusion of logic devices at selected crosspoints of a decoder portion of a PLA in a manner such that a selected word line in the ROM portion is activated in response to the logic state of two or more decoder word lines is considered a particular departure from prior art thinking.

The invention thus comprises an integrated semiconductor chip including a combination of a word organized memory portion with word lines and a decoder portion with output lines for driving those word lines selectively in response to each one of a set of input codes. The combination is characterized in that at least some of the output lines from the decoder portion are combined logically or associated such that a group thereof is connected to a single one of the word lines in the memory portion so that a word line is selected in response to more than one of a set of input codes. In embodiments where ground lines are employed in the decoder portion, the number of requisite ground lines is reduced as well as the number of word lines.

DETAILED DESCRIPTION

Figure 1:
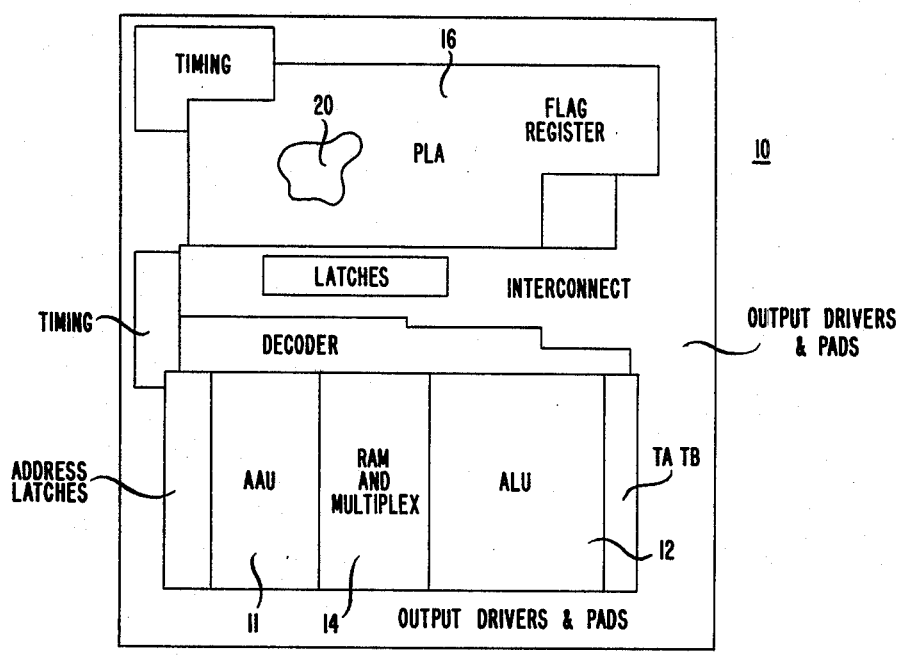
FIG. 1 is a functional block diagram of a representative semiconductor microprocessor chip.

FIG. 1 shows a block diagram of an illustrative single chip semiconductor microprocessor 10. The block diagram shows an allocation of space in the chip to various functions familiar to those skilled in the area of semiconductor integrated circuitry. The chip is implemented with CMOS technology in a manner well understood in the art and the various devices therein are designated "P" and "N", in later Figures herein, to indicate P-channel and N-channel devices, respectively, in accordance with widely-accepted convention.

Common to such circuitry are various arithmetic units designed to perform logic functions on signals applied to their inputs. The most familiar of these are the AAU (address arithmetic unit) and the ALU (arithmetic logic unit), represented by blocks 11 and 12 in the Figure. Also included in such circuitry is a RAM (random access memory) with associated multiplexing circuitry as is represented by block 14 in the Figure. The general organization and operation of such a chip is described in *Computer Architecture*, 2nd Edition, Claxton C. Foster, Van Nostrand Co., New York, 1976.

The operation of the various functional elements of a microprocessor of the type shown in FIG. 1 is controlled by a PLA or programable logic array represented by block 16 in the Figure. As is well known, a PLA comprises a ROM or read-only memory portion along with a decoder portion for selecting word lines in the ROM. We will direct our attention primarily to the decoder portion and will show that the inclusion of logic means at crosspoints or intersections between input (address) lines and output (word) lines of the decoder portion permits the activation of at least some of the output lines in response to more than one input code even in cases where those codes cannot be related by "don't care" conditions. An illustrative PLA employing ground lines in the decoder portion is shown to illustrate a savings in both the number of word lines in the ROM and the number of ground lines in the decoder portion.

Figure 2:
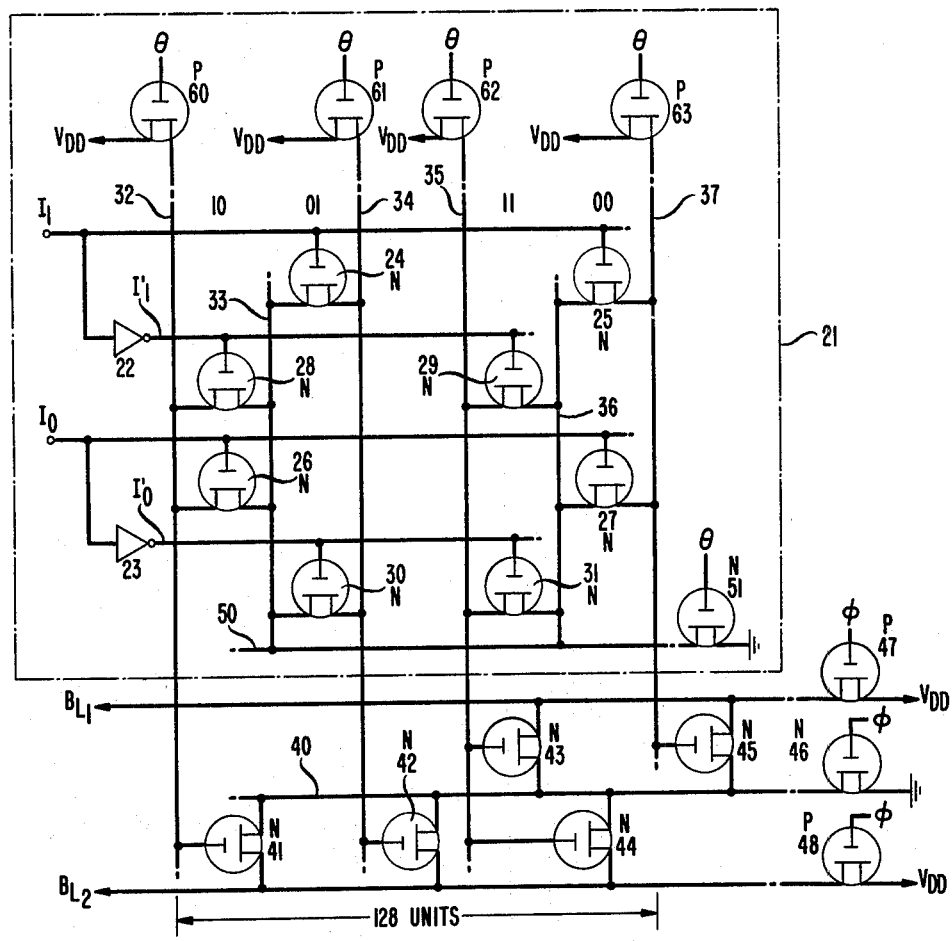
FIG. 2 is an enlarged schematic top view of a portion of the memory of FIG. 1 in accordance with prior art teaching.

Area 20 of FIG. 1 includes a representative portion of a PLA decoder and ROM portions. A familiar schematic representation is employed. The actual semiconductor diffusion regions and interconnecting elements are not shown. FIG. 2, specifically, shows a representative number of horizontal (address) and vertical (word) lines representing electrical conductors and defining crosspoints therebetween. The upper portion of the Figure, encompassed by broken line 21, represents the decoder portion. Two representative horizontal lines of the decoder portion are designated arbitrarily $I_1$ and $I_0$ in conventional fashion. Each line has a related horizontal line, $I_1'$ and $I_0'$, to which it is connected by inverters 22 and 23, respectively. The $I_1$ line is connected to the gates of N-channel devices 24 and 25. Line $I_0$ is connected to the gates of N-channel devices 26 and 27. Similarly, lines $I_1'$ and $I_0'$ are connected to the gates of N-channel devices 28 and 29 and to the gates of N-channel devices 30 and 31, respectively.

The vertical lines of the decoder portion are designated 32, 33, 34, 35, 36, and 37. The drain and source of devices 26 and 28 and 29 and 31 are connected to lines 32 and 33 and to lines 35 and 36, respectively. The sources and drains of devices 24 and 30 and 25 and 27 are connected to lines 33 and 34 and to lines 36 and 37 in a similar manner.

The ROM portion of the PLA also includes horizontal and vertical lines. The horizontal lines are bit lines and are designated $BL_1$ and $BL_2$. A ground line 40 also is shown. The vertical lines are word lines in the ROM and can be seen to comprise extensions of lines 32, 34, 35, and 37 of the decoder portion of the PLA.

The vertical (word) lines of the ROM are connected to gates of N-channel devices. Specifically, line 32 and line 34 are connected to the gates of N-channel devices 41 and 42 and line 35 is connected to the gates of N-channel devices 43 and 44. Line 37 is connected to the gate of N-channel device 45. Ground line 40 is connected to the drain of N-channel device 46. The gate of device 46 is connected to a source of voltage $\Phi$. The source of device 46 is connected to a reference potential, typically ground. Bit lines $BL_1$ and $BL_2$ are connected to the drains of P-channel devices 47 and 48, respectively. The sources of devices 47 and 48 are connected to a supply voltage $V_{DD}$, and the gates are connected to a source of voltage $\Phi$.

Horizontal line 50 of the decoder portion interconnects vertical lines 33 and 36 to the drain of an N-channel device 51. The source of device 51 is connected to a reference potential (ground) and the gate is connected to a source of voltage $\Phi$.

The operation of the prior art arrangement of FIGS. 1 and 2 are now described briefly. Specifically, an illustrative operation commences with the precharging of the word lines of the decoder portion and ROM and the bit lines of the ROM. That is to say, vertical lines 32, 34, 35, and 37 are charged to a high voltage level via P-channel devices 60, 61, 62, and 63 to the drains of which those lines are connected respectively. The sources of those devices are connected to a reference potential and the gates are connected to source of voltage $\Phi$. In addition, horizontal lines $BL_1$, and $BL_2$ are charged to a high voltage level via P-channel devices 47 and 48. Address codes are applied to the horizontal lines $I_0$ and $I_1$..., and ones of devices 24, 25, 26, 27, 28, 29, 30 and 31 are turned off according to the address code. At this point, timing signal $\Phi$ goes to a high level. This turns off devices 60, 61, 62, and 63 and turns device 51 on. Device 51, at this juncture, allows certain of word lines 32, 34, 35, and 37 to discharge through certain ones of devices 24 through 31 depending on the particular address code applied. The result is a pattern of charged word lines in the ROM portion of FIG. 1.

Certain ones of devices 41-45 ... in the ROM are now turned on depending on the pattern of word lines 32, 34, 35, and 37 left in a precharged state. At this point timing signal $\Phi$ goes low, turning devices 47 and 48 off and turning device 46 on. This allows certain ones of the bit lines in ROM to discharge to ground via the ground line depending on the selective placement of devices in the ROM. The discharge of the bit lines is controlled by the word lines which have not been discharged by the decoder portion.

In this illustrative prior art arrangement, for each input (address) code only one word line in the decoder portion is left charged although this is not generally the case for prior art decoders. That this is the case in the arrangement of FIG. 2 may be realized by comparing the operation for two input codes 10 ... and 01 .... In the first instance, devices 24, 25, 30, and 31 are activated and lines 34, 35, and 37 are discharged via device 51. Line 32 remains charged. If the input code 01 is applied, on the other hand, devices 28, 29, 26, and 27 are activated and lines 32, 35, and 37 are discharged. Line 34 remains charged.

Figure 3:
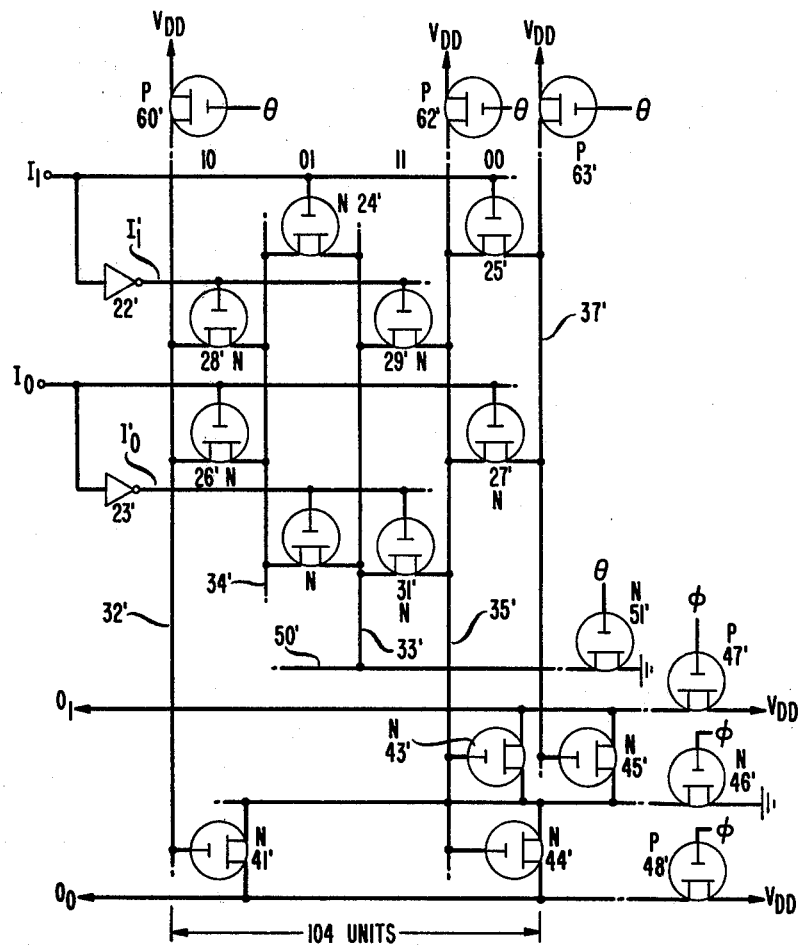
FIG. 3 is an enlarged schematic top view of a portion of the memory of FIG. 1 alternative to that shown in FIG. 2 and organized in accordance with an embodiment of this invention.

FIG. 3 shows an illustrative embodiment of this invention wherein the operation described in connection with FIG. 2 is permitted with a simpler circuit requiring a reduced amount of surface area for its implementation. Like designations are used for like elements in the two Figures, prime notation being used in conjunction with the indication of FIG. 3. Accordingly, the vertical lines in FIG. 3 are designated 32', 33', 34', 35', and 37'.

Note that there is no line corresponding to line 36, no device corresponding to device 61, and no device corresponding to device 42. The absence from FIG. 3 of the elements noted above leads to a considerable savings in chip area. Specifically, as noted in the Figures, the spacing between lines 32 and 37 in FIG. 2 is 128 design units whereas the spacing between lines 32' and 37' in FIG. 3 is 104 design units. In a typical PLA, 80% of the word lines may be implemented in accordance with the teachings of this invention to compress the area occupied. Thus, a chip previously requiring 3840 design units (2880 microns) requires only 3116 design units (2337 microns) in accordance with the principles of this invention.

It may be observed that word line 32' in FIG. 3 has the logical function C=A+B, where A is the condition which selects word line 32 of FIG. 2 and B is the condition which selects word line 34 of FIG. 2. Also word line 37' of FIG. 3 is selected on condition F=D+E, where D is the condition which selects word line 35 of FIG. 2 and E is the condition which selects word line 37 of FIG. 2. Otherwise, the operation is essentially the same as in FIG. 2. It is important to assign word lines to positions 35' and 37' in FIG. 3 for which no logic ones exist in the ROM under word line 35' in positions where logic zeros also exist under word line 37'. This caveat is observed so that data under word line 37' does not overwrite data under word line 35' when word line 35' is selected.

In another embodiment of this invention, a memory word line having the logical function $C=\overline{A}B$, where A and B are two ordinary word lines A and B, can be realized. Specifically, a word line C is selected whenever a word line B of a like prior art PLA, in accordance with FIG. 2, were high (selected) and a word line A were low. Such a function is particularly useful in, for example, implementing a state transition diagram where the operation proceeds from state 1 to state 2 in response to instructions 1, 2, or 3 and proceeds to state 3 in response to instruction 4. In this instance the transition to state 2 could be implemented on condition C=NOT (instruction 4) AND (state 1).

Figure 4:
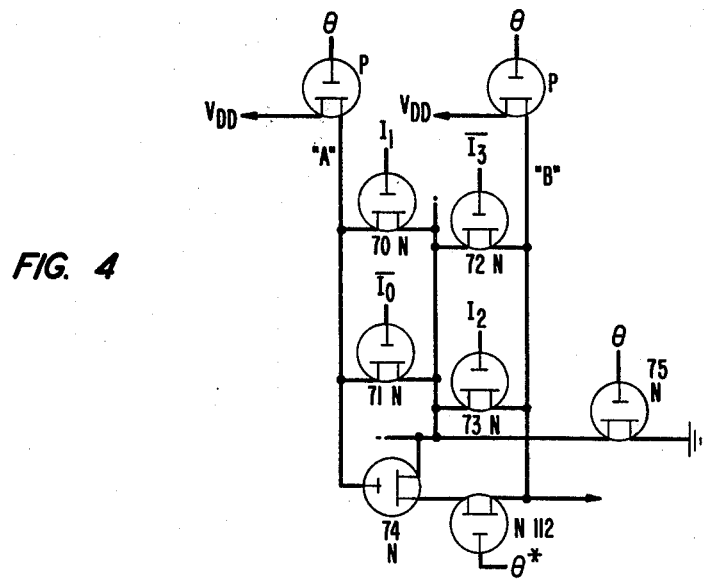

The function $C=\overline{A}B$ is implemented as shown in FIG. 4. A portion of the decoder portion of a PLA is shown including word lines "A" and "B". The Figure also shows N-channel devices 70 and 71, and 72 and 73, the drains of which are connected to word lines "A" and "B", respectively. The gates of the devices are connected to the inputs of the decoder portion in the manner of FIG. 3. Word line "A" can be seen to be connected to the gate of N-channel device 74. The drain of device 74 is connected to word line "B" (indirectly as described hereinafter). The sources of all of devices 70 through 74 are connected to the drain of an N-channel device 75. The source of device 75 is connected to a reference potential (such as ground), and the gate of device 75 is connected to a source of timing signal $\theta$ as already discussed. The extension of word line "B" is the word line C of the associated ROM portion on which the function $F=\overline{A}B$ appears.

Figure 5:
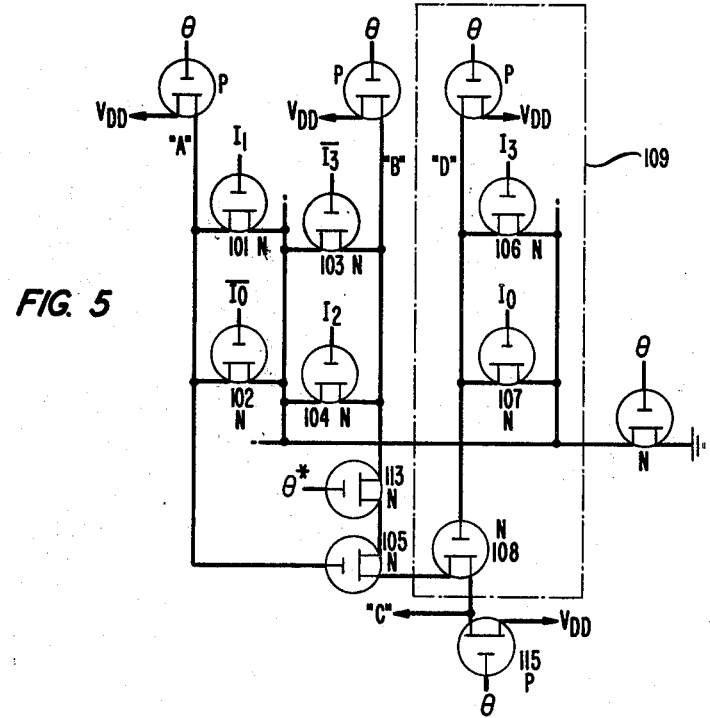
FIGS. 4 and 5, are schematic representations of alternative arrangements in accordance with embodiments of this invention.

A number of other combinations are possible as shown by the representations of FIG. 5. In this Figure, the word lines in the decoder portions are designated A, B and D and the output is shown on word line C of the associated ROM.

Line C of the arrangement exhibits the function $C=\overline{A}+B+\overline{D}$. The Figure shows the drains of N-channel devices 101, 102, 103, 104, 106 and 107 to lines A, B and D, respectively, the sources and gates again being connected as shown in the previous FIG. 4. In this embodiment, line A is connected to the gate of an N-channel device 105. Line B is connected to the drain of device 105. Line D is connected to the gate of N-channel device 108. The drain of device 108 is connected to the source of device 105 and the source of device 108 is connected to line C.

A portion of FIG. 5 is shown encompassed by broken line 109. The Figure thus represents two separate embodiments, one with the circuit as shown; one without the portion of the circuit within line 109. In this latter case, the source of device 105 is connected to line C. The arrangement of FIG. 5 (in the absence of that portion within line 109) is particularly useful in, for example, implementing a state transition diagram where the operation proceeds from state 1 to state 2 in response to instructions 1, 2, and 3, or from state 3 to state 2 in response to any of instructions 1, 2, 3 or 4. In this instance, the transition to state 2 could be implemented on condition C=NOT (instruction 4) OR (state 3).

Each of the embodiments of FIGS. 4 and 5 exhibit a race condition which may be overcome by any of a number of conventional approaches. One approach is to include an N-channel device 112 between device 74 of FIG. 4 and line C and N-channel device 113 between devices 104 and 105 in FIG. 5 as shown. Such devices are gated by a timing pulse $\theta$ which is delayed to allow lines A and B sufficient time to discharge (before "D"). An additional P channel device 115 is shown in FIG. 5 to ensure that line C is raised to the supply voltage $V_{DD}$ when device 113 is used.

It is clear from the foregoing description that the inclusion of logic means between two or more word lines of a decoder portion of a PLA can reduce the number of outputs which must be brought out of the decoder portion and thus reduce the number of word lines in an associated ROM portion. At least some of the word lines in the ROM portion are then electrically controlled by more than one word line in the decoder portion, and therefore are responsive to more than one input code. Further, the various input codes to which the word line is responsive need not be related by common "don't care" conditions.

The foregoing description is considered merely illustrative of the principles of this invention. Accordingly, various modifications thereof can be devised by those skilled in the art in accordance with those principles within the spirit and scope of the invention as encompassed by the following claims. For example, arrangements similar to those shown in FIGS. 4 and 5 can be devised to exhibit the functions $C=\overline{AB}$ and $C=\overline{A}+\overline{B}$. Further, the various arrangements can be extended to three word lines or more in each instance particularly as shown in FIG. 5.

We claim:

1. A semiconductor integrated circuit arrangement comprising a semiconductor chip having defined therein a first and a second portion, said first and second portions including word lines, said second portion including address lines, and a plurality of logic devices at selected crosspoints between said word lines and address lines of said first portion, CHARACTERIZED IN THAT ones of said word lines in said first portion are associated lines organized in groups of two or more, each group being connected to a single one of said word lines in said second portion.

2. An arrangement in accordance with claim 1 in which said first and second portions comprise decoder and ROM portions of a PLA.

3. A circuit arrangement in accordance with claim 1 in which selected ones of said devices connect one of said two or more associated lines of a group to a next one of said associated lines responsive to an external signal applied to said address lines.

4. An arrangement in accordance with claim 2 wherein one of said groups of two lines A and B of said decoder portion is adapted to exhibit the function $C=A+B$ on the associated said single one C of said word lines.

5. An arrangement in accordance with claim 2 wherein one of said groups of two lines A and B of said decoder portion is adapted to exhibit the function $C=\overline{A}+B$ on the associated said single one C of said word lines.

6. An arrangement in accordance with claim 2 wherein said decoder portion includes at least one word line which does not extend into said ROM portion and is not held at a reference potential.

* * * * *